United States Patent
Kondou et al.

(10) Patent No.: US 8,532,442 B2
(45) Date of Patent: Sep. 10, 2013

(54) OPTICAL WAVEGUIDE-FORMING EPOXY RESIN COMPOSITION, OPTICAL WAVEGUIDE-FORMING CURABLE FILM, OPTICAL-TRANSMITTING FLEXIBLE PRINTED CIRCUIT, AND ELECTRONIC INFORMATION DEVICE

(75) Inventors: Naoyuki Kondou, Sakai (JP); Junko Yashiro, Hirakata (JP); Shinji Hashimoto, Kadoma (JP); Tohru Nakashiba, Osaka (JP)

(73) Assignee: Panasonic Corporation, Osaka (JP)

( * ) Notice: Subject to any disclaimer, the term of this patent is extended or adjusted under 35 U.S.C. 154(b) by 126 days.

(21) Appl. No.: 13/258,517

(22) PCT Filed: Mar. 26, 2010

(86) PCT No.: PCT/JP2010/056039
§ 371 (c)(1),
(2), (4) Date: Sep. 22, 2011

(87) PCT Pub. No.: WO2010/110495
PCT Pub. Date: Sep. 30, 2010

(65) Prior Publication Data
US 2012/0033913 A1 Feb. 9, 2012

(30) Foreign Application Priority Data
Mar. 26, 2009 (JP) ................... 2009-077788

(51) Int. Cl.
*G02B 6/12* (2006.01)
*G02B 6/00* (2006.01)
(52) U.S. Cl.
USPC .............................. 385/14; 385/143; 385/145
(58) Field of Classification Search
None
See application file for complete search history.

(56) References Cited

U.S. PATENT DOCUMENTS

| 7,212,700 | B2 | 5/2007 | Naitou et al. ............. 385/14 |
| 2001/0055461 | A1 | 12/2001 | Tomaru et al. |
| 2004/0053061 | A1 | 3/2004 | Yonezawa et al. |
| 2006/0086533 | A1 | 4/2006 | Naitou et al. ............. 174/255 |
| 2008/0260341 | A1 | 10/2008 | Shibata et al. |
| 2008/0268237 | A1 | 10/2008 | Yonezawa et al. |
| 2008/0268257 | A1 | 10/2008 | Yonezawa et al. |
| 2009/0053518 | A1* | 2/2009 | Saiki et al. ............. 428/352 |
| 2009/0142026 | A1* | 6/2009 | Shioda ............. 385/131 |
| 2009/0166897 | A1 | 7/2009 | Katsurayama et al. |
| 2010/0150510 | A1* | 6/2010 | Sato et al. ............. 385/130 |
| 2010/0266258 | A1 | 10/2010 | Shibata et al. |
| 2011/0033614 | A1 | 2/2011 | Nakashiba et al. |
| 2011/0243495 | A1 | 10/2011 | Nakashiba et al. |

FOREIGN PATENT DOCUMENTS

| CN | 1479768 A | 3/2004 |
| CN | 101223206 A | 7/2008 |
| JP | 3063903 | 7/2000 |
| JP | 2001-343539 | 12/2001 |
| JP | 2003-147045 | 5/2003 |
| JP | 2006-152016 | 6/2006 |
| JP | 2006-154684 | 6/2006 |
| JP | 2006-332150 | 12/2006 |
| JP | 2007-84772 | 4/2007 |
| JP | 2007-119585 | 5/2007 |
| TW | 2006-28540 A | 8/2006 |
| TW | 2009-08847 A | 2/2009 |
| WO | 2008/053888 | 5/2008 |
| WO | WO 2008053888 A1 * | 5/2008 |

OTHER PUBLICATIONS

U.S. Appl. No. 13/258,551 to Naoyuki Kondou et al., which was filed on Sep. 22, 2011.
U.S. Appl. No. 13/258,598 to Tohru Nakashiba et al., which was filed on Sep. 22, 2011.
Search report from PCT/JP2010/056039, mail date is Jul. 23, 2010.

* cited by examiner

*Primary Examiner* — Omar Rojas
(74) *Attorney, Agent, or Firm* — Greenblum & Bernstein, P.L.C.

(57) ABSTRACT

An optical waveguide of excellent flex resistance which is to be formed on the surface of a flexible printed circuit is obtained by using an epoxy resin composition includes (A) a liquid epoxy compound, (B) a solid epoxy compound, and (C) a cationic curing initiator, wherein as the liquid epoxy compound (A), (A1) a liquid epoxy compound represented by general formula (I) below is included:

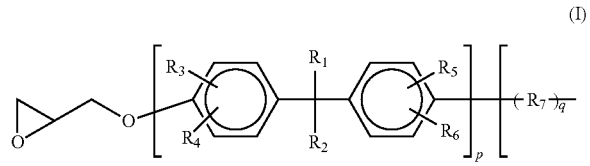
(I)

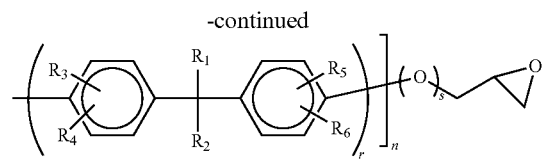
-continued (where $R_1$ and $R_2$ are each independently a hydrogen atom or a methyl group; $R_3$ to $R_6$ are each independently a hydrogen atom, a methyl group, a chlorine atom or a bromine atom; $R_7$ is an alkyleneoxy group or alkylene group of 1 to 15 carbons; p is 0 or 1; q is 1 to 25; r and s are 0 when p is 0, and are 1 when p is 1; and n is a positive integer which averages from 1 to 5).

5 Claims, 3 Drawing Sheets

OPTICAL WAVEGUIDE-FORMING EPOXY RESIN COMPOSITION, OPTICAL WAVEGUIDE-FORMING CURABLE FILM, OPTICAL-TRANSMITTING FLEXIBLE PRINTED CIRCUIT, AND ELECTRONIC INFORMATION DEVICE

TECHNICAL FIELD

The present invention relates to an epoxy resin composition for forming an optical waveguide to be disposed in, for example, the hinge of an electronic information device, a curable film obtained from the said epoxy resin composition, an optical-transmitting flexible printed circuit, and an electronic information device.

BACKGROUND ART

In electronic information devices, by using optical transmission to send and receive large amounts of information such as image data, efforts are being made to achieve high-speed processing while avoiding electromagnetic noise. A key elemental technology in such optical transmission are optical waveguide-based optical interconnections within the device for enabling signal transmission by converting electrical signals from an LSI chip or an integrated circuit, for example, into light. In internal optical interconnections, a 30 to 100 μm multimode waveguide is optimal to facilitate positioning between the optical input/output of the optical waveguide and the light-receiving/light-emitting elements. Polymer waveguides, which have a low optical loss, are easy to mass produce, and can be easily integrated with electrical circuit boards, are attracting attention as such multimode waveguides.

However, in recent years, there has been a demand for ever smaller sizes in information devices and terminals such as cell phones and mobile devices. To address this demand and achieve smaller device sizes, flexible printed circuits are being used by bending the circuit carrier and placing it in the narrow space within a small housing, and device configurations in which display and main unit can be folded together using hinges are being adopted.

When interior optical interconnection technology utilizing a polymer waveguide is employed in such downsized information devices and terminals, the polymer waveguide that is formed on a flexible printed circuit (hereinafter, also referred to as "FPC") is required to have flex resistance so that it does not fail when repeatedly folded at a small radius of curvature. Also, when a photoelectric conversion element or the like is surface mounted on the FPC in which a polymer waveguide has been formed, the polymer waveguide must have a heat resistance capable of withstanding the high-temperature reflow conditions for lead-free solder. In addition, the polymer waveguide is required, of course, to have a good transparency with low optical loss.

The acrylic resins that are widely used in the manufacture of optical fibers are known as polymer materials for forming such polymer waveguides. However, because acrylic resins have a low heat resistance, they are unable to withstand the high-temperature reflow conditions for lead-free solder. Therefore, in cases where acrylic resin was used to form an optical waveguide on a substrate and an attempt was made to mount a photoelectric conversion element or the like at a light-receiving or light-emitting portion of the optical waveguide, it was found to be impossible to utilize a mounting process that employs a reflow operation. For this reason, it was necessary to position the waveguide core by aligning it, on an order of several tens of micrometers, with a photoelectric conversion element or the like that had been mounted beforehand on another substrate. Such a mounting process is very cumbersome and hardly conducive to mass production.

Methods of forming optical waveguides using curable resins such as epoxy compounds, which are polymeric material having a high heat resistance and also having a good interlayer adhesion, are also known.

For example, Patent Document 1 below discloses art for fabricating an optical waveguide, wherein a liquid photocurable resin solution containing an oxetane resin, an epoxy resin and a photopolymerization initiator is coated onto a substrate surface, following which a cladding or core is formed by carrying out pattern exposure and development.

Patent Document 2 below discloses art for forming an optical waveguide core, wherein a liquid photocurable epoxy resin containing a polyfunctional reactive oligomer and a photopolymerization initiator is used as a polymeric material to form a cladding or core, and this photocurable epoxy compound solution is coated onto a silicon substrate, following which pattern exposure and development are carried out.

Patent Document 3 below discloses a resin film for forming optical materials such as optical waveguides, which film is obtained by applying a varnish composed of a phenoxy resin or a solid epoxy resin dissolved in a solvent onto a substrate, then removing the solvent.

However, because the glass transition temperature (Tg) of epoxy resins is too high, such resins have basically a poor flexibility. Even when polymer materials such as those disclosed in Patent Documents 1 to 3 are used, they lack sufficient flex to withstand use as an optical waveguide in a hinge.

CITATION LIST

Patent Literature

Patent Document 1: Japanese Patent Application Laid-open No. 2001-343539
Patent Document 2: Japanese Patent No. 3063903
Patent Document 3: Japanese Patent Application Laid-open No. 2007-84772

SUMMARY OF THE INVENTION

It is therefore an object of the present invention to provide an optical waveguide having excellent flex resistance which is to be formed on the surface of a flexible printed circuit.

The optical waveguide-forming epoxy resin composition according to one aspect of the invention is composed of (A) a liquid epoxy compound, (B) a solid epoxy compound, and (C) a cationic curing initiator, wherein the liquid epoxy compound (A) includes (A1) a liquid epoxy compound represented by general formula (I) below.

[C1]

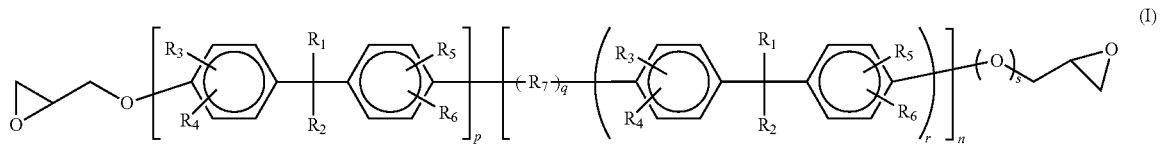
(I)

(In general formula (I), $R_1$ and $R_2$ are each independently a hydrogen atom or a methyl group; $R_3$ to $R_6$ are each independently a hydrogen atom, a methyl group, a chlorine atom or a bromine atom; and $R_7$ is an alkyleneoxy group or alkylene group of 1 to 15 carbons. Also, p is 0 or 1; q is 1 to 25; r and s are 0 when p is 0, and are 1 when p is 1; and n is a positive integer which averages from 1 to 5.)

The optical waveguide-forming curable film according to another aspect of the invention is characterized by being obtained from the foregoing optical waveguide-forming epoxy resin compositions.

The optical-transmitting flexible printed circuit according to yet another aspect of the invention has an optical waveguide composed of a cladding and/or a core obtained by curing the above optical waveguide-forming epoxy resin compositions.

The electronic information device according to a further aspect of the invention is composed of two structural members which can be folded together by means of a hinge. The two structural members are optically connected through the hinge, and the above optical-transmitting flexible printed circuit is disposed at the hinge.

DESCRIPTION OF EMBODIMENTS

Figure 1A:
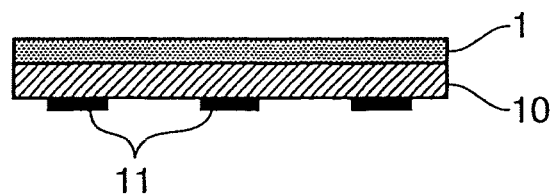
FIGS. 1A to 1F are schematic cross-sectional diagrams showing a method of forming an optical waveguide on the surface of a FPC.

In a embodiment of the present invention, the optical waveguide-forming epoxy resin composition includes (A) a liquid epoxy compound, (B) a solid epoxy compound, and (C) a cationic curing initiator. The liquid epoxy compound (A) includes (A1) an epoxy compound of above general formula (I).

The liquid epoxy compound (A), which is an epoxy compound that is liquid at standard temperature, is an ingredient that confers tackiness to the curable film following solvent removal, thereby increasing the adhesiveness of the film to fiberglass-reinforced plastic (FRP).

The liquid epoxy compound of above general formula (I) is liquid at standard temperature, has epoxy groups at both ends of the molecular chain, and has a molecular chain without any active hydrogens thereon or functional groups that form active hydrogens, such as a polyalkyleneoxy chain. Including such a liquid epoxy compound (A1) enables the crosslink density of the cured product to be lowered while maintaining the transparency required of an optical waveguide. Hence, by conferring the cured product with flexibility, an optical waveguide having an excellent flex resistance can be formed.

Illustrative examples of liquid epoxy compounds of general formula (I) include polyalkylene glycol diglycidyl ethers such as polyethylene glycol diglycidyl ether, polypropylene glycol diglycidyl ether and polybutylene glycol diglycidyl ether (e.g., Epiol E-1000 and Epiol E-400, both available from NOF Corporation; and YL7410, available from Japan Epoxy Resins Co., Ltd.). These may be used singly or as combinations of two or more thereof.

It is especially preferable for the liquid epoxy compound of general formula (I) to be a liquid resin expressed by general formula (II) below.

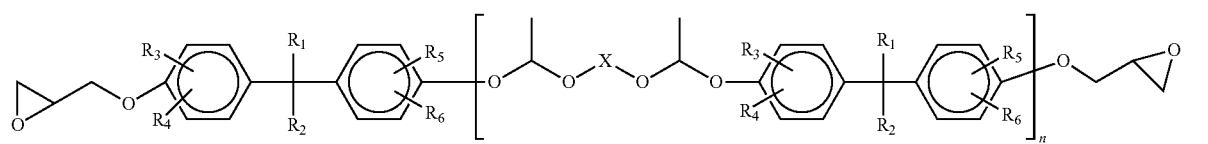

(II)

(In general formula (II), $R_1$ and $R_2$ are each independently a hydrogen atom or a methyl group; $R_3$ to $R_6$ are each independently a hydrogen atom, a methyl group, a chlorine atom or a bromine atom; X is an ethyleneoxy, di(ethyleneoxy)ethyl, tri(ethyleneoxy)ethyl, propyleneoxy, propyleneoxypropyl, di(propyleneoxy)propyl, tri(propyleneoxy)propyl group, or an alkylene group of 2 to 15 carbons; and n is a positive integer which averages from 1.2 to 5.)

Illustrative examples of epoxy compounds having the structure of the above general formula (II) include, for example, the Epiclon EXA-4850 Series produced by DIC Corporation. These may be used singly or as combinations of two or more thereof. In particular, epoxy compounds having the structure of general formula (II), when included in a small amount, are able to impart the optical waveguide with a high flex resistance. For this reason, they are able to confer a high flex resistance without greatly lowering the heat resistance of the optical wave guide.

The content of the liquid epoxy compound (A1) is preferably in a range of from 5 to 40 mass %, and more preferably from 5 to 30 mass %, of the overall resin components in the epoxy resin composition. If this content is too high, the glass transition temperature $T_g$ will decrease excessively, as a result of which the heat resistance will tend to become inadequate. On the other hand, if this content is too low, the flex resistance enhancing effect will tend to be inadequate.

The liquid epoxy compound (A) may include a liquid epoxy compound other than liquid epoxy compound (A1). Illustrative examples of such other liquid epoxy compounds include liquid bisphenol-type epoxy compounds such as liquid bisphenol A-type epoxy compounds (e.g., Epiclon 850, available from DIC Corporation), liquid bisphenol F-type epoxy compounds (e.g., Epiclon 830S, available from DIC Corporation), liquid bisphenol E-type epoxy compounds and liquid bisphenol S-type epoxy compounds; liquid hydrogenated bisphenol-type epoxy compounds such as liquid hydrogenated bisphenol A-type epoxy compounds (e.g., YX8000, available from Japan Epoxy Resins Co., Ltd.), liquid hydrogenated bisphenol F-type epoxy compounds, liquid hydrogenated bisphenol E-type epoxy compounds and liquid hydrogenated bisphenol S-type epoxy compounds; and liquid epoxy compounds having a 3,4-epoxycyclohexenyl skeleton, such as liquid 3,4-epoxycyclohexenylmethyl-3',4'-epoxycyclohexene carboxylate (e.g., Celloxide 2021P, available from Daicel Chemical Industries, Ltd.) and liquid ε-caprolactone-modified 3,4-epoxycyclohexenylmethyl-3',4'-epoxycyclohexane carboxylate (e.g., Celloxide 2081, available from Daicel Chemical Industries, Ltd.).

The solid epoxy compound (B) is an ingredient which is included for the purpose of increasing the shape retention of the curable film by rendering the epoxy resin composition following solvent removal into a solid state, and also to regulate the tackiness of the curable film.

Illustrative examples of the solid epoxy compound (B) include solid bisphenol-type epoxy compounds such as solid bisphenol A-type epoxy compounds (e.g., Epikote 1006FS, available from Japan Epoxy Resins Co., Ltd.), solid bisphenol F-type epoxy compounds (e.g., Epikote 4007, available from Japan Epoxy Resins Co., Ltd.), solid bisphenol E-type epoxy compounds and solid bisphenol S-type epoxy compounds; solid hydrogenated bisphenol-type epoxy compounds such as solid hydrogenated bisphenol A-type epoxy compounds (YL7170, available from Japan Epoxy Resins Co., Ltd.), solid hydrogenated bisphenol F-type epoxy compounds, solid hydrogenated bisphenol E-type epoxy compounds and solid hydrogenated bisphenol S-type epoxy compounds; and solid 1,2-epoxy-4-(2-oxiranyl)cyclohexane adducts of 2,2-bis(hydroxymethyl)-1-butanol (e.g., EHPE 3150, available from Daicel Chemical Industries, Ltd.).

It is preferable to include in the above-described liquid epoxy compound (A) and solid epoxy compound (B) a given proportion of hydrogenated bisphenol-type epoxy compounds, based on the overall amount of epoxy compounds in the epoxy resin composition. The hydrogenated bisphenol-type epoxy compounds are ingredients which, when the content thereof is increased, help to lower the index of refraction and enhance the transparency, and also help to confer flexibility without causing a decline in the heat resistance. The hydrogenated bisphenol-type epoxy compounds are preferably included in a content, based on the overall amount of resin components in the epoxy resin composition, within a range of from 40 to 80 mass % for cladding formation, and within a range of from 0 to 50 mass % for core formation.

It is also preferable in include in the above-described liquid epoxy compound (A) and solid epoxy compound (B) a given proportion of bisphenol-type epoxy compounds, based on the overall amount of epoxy compounds in the epoxy resin composition. By including bisphenol-type epoxy compounds, the brittleness of the optical waveguide can be reduced and the toughness increased; moreover, increasing the content of such a compound makes it possible to elevate the refractive index. The bisphenol-type epoxy compounds are preferably included in a content, based on the overall amount of resin components in the epoxy resin composition, within a range of from 0 to 50 mass for cladding formation, and within a range of from 10 to 90 mass for core formation.

The epoxy compound having a 3,4-epoxycyclohexenyl skeleton within the liquid epoxy compound (A) is an ingredient which increases the transparency of the optical waveguide obtained, thereby lowering optical loss, and which also imparts a high tackiness to the curable film. In addition, it makes it possible to obtain a photocurable film having a high cure rate in the curing step. When the photocurable film is pattern-exposed and developed to fabricate the waveguide core, roughness readily arises at both sidewalls of the core due to development; at both sidewalls of the core, light scatters and tends to escape to the cladding, generally giving rise to optical loss of the wave guide. However, when an epoxy compound having a 3,4-epoxycyclohexenyl skeleton is included, these sidewall portions of the core exhibit a greater decline in the refractive index than does the interior of the core. As a result, the amount of light which escapes from both sidewalls of the core to the cladding decreases, enabling optical loss of the wave guide to be reduced. The content of epoxy compound having a 3,4-epoxycyclohexenyl skeleton as a proportion of the overall resin components in the epoxy resin composition is preferably in a range of from 0 to 20 mass % for cladding formation, and preferably in a range of from 5 to 20 mass % for core formation.

The 1,2-epoxy-4-(2-oxiranyl)cyclohexane adduct of 2,2-bis(hydroxymethyl)-1-butanol in the solid epoxy compound (B) is an ingredient which enhances the heat resistance by increasing the glass transition temperature Tg of the cured product. Moreover, increasing the content of this ingredient will lower the refractive index and also help to improve the transparency. The content of the 1,2-epoxy-4-(2-oxiranyl)cyclohexane adduct of 2,2-bis(hydroxymethyl)-1-butanol, based on the overall amount of resin ingredients in the epoxy resin composition, is preferably in a range of from 3 to 15 mass % for cladding formation, and preferably in a range of from 0 to 20 mass % for core formation. Too high a content tends to diminish the flexibility of the cured product, lowering the flex resistance of the cladding.

The contents (mass ratios) of the liquid epoxy compound (A) and the solid epoxy compound (B) are suitably adjusted according to the intended purpose and the types of epoxy compounds to be combined. For example, it is preferable for the ratio therebetween, that is, solid epoxy compound (B)/liquid epoxy compound (A), to be in a range of from 30/70 to 80/20.

In addition to epoxy compounds, the epoxy resin composition of the embodiment preferably includes also, as a resin-forming ingredient, a phenoxy resin. The phenoxy resin is a polyhydroxy polyether synthesized from, for example, an epoxy compound and epichlorohydrin, and is a thermoplastic resin which can be crosslinked by hydroxyl groups on the molecule. Including a phenoxy resin reduces the brittleness of the cured product, thus increasing the toughness of the cured product and thereby making it possible to further enhance the flex resistance of the optical waveguide. Also, this ingredient, by increasing the viscosity of the varnish when a curable film is prepared, facilitates production of the curable film. The phenoxy resin is exemplified by YP50, which is available from Tohto Kasei Co., Ltd. The phenoxy resin content, based on the overall resin ingredients in the epoxy resin composition, is preferably in a range of from 0 to 25 mass %. At an excessively high phenoxy resin content, the thixotropic properties of the varnish will become too high, which will tend to lower the varnish coatability during production of the curable film.

The cationic curing agent is a polymerization initiator for inducing the ring-opening self-polymerization of epoxy groups on the epoxy compound. There are photocationic curing agents which are able to initiate curing only under the influence of light, thermocationic curing agents which are able to initiate curing only under the influence of heat, and photo/thermocationic curing agents which are able to initiate curing under the influence of either light or heat. Any of these may be used. By including a cationic curing agent, the transparency of the cladding can be increased, enabling the optical loss to be reduced.

Photocationic curing agents are exemplified by SP-170 (an $SbF_6$ sulfonium salt), which is available from Adeka Corporation. Thermocationic curing agents are exemplified by SI-150L (a $SbF_6$ sulfonium salt), which is available from Sanshin Chemical Industry Co., Ltd. These may be used singly or as combinations of two or more.

The cationic curing agent is preferably included in an amount within a range of from 0.5 to 2 parts by mass per 100 parts by mass of the resin-forming ingredients in the epoxy resin composition.

Additives such as surface modifiers, coupling agents, flow enhancers, lubricants and colorants may be optionally added as ingredients other than the above to the epoxy resin composition used in the present embodiment, insofar as such addition does not compromise the objects of the invention.

The epoxy resin composition is obtained by selecting a formulation which becomes a solid at standard temperature when a varnish, prepared by dissolving the liquid epoxy compound (A) and the solid epoxy compound (B) in given proportions within a solvent and adding also a cationic curing initiator, is dried to remove the solvent.

The solvent used to prepare the varnish is not subject to any particular limitation, provided it is capable of dissolving the above-described ingredients. Illustrative examples of the solvent include methyl ethyl ketone, cyclohexanone and propylene glycol monomethyl ether acetate (PGMEA). These may be used singly or as combinations of two or more thereof.

The mixing proportions of the resin ingredients and the solvent within the varnish are not subject to any particular limitation, provided they are suitably adjusted so as to give a viscosity appropriate for placing (filling) the mixture on the surface of the FPC in the state of a varnish.

In cases where an optical waveguide is formed on the surface of a FPC, a cured layer may be formed by using a coating operation in which the varnish is coated onto the surface of the FPC then dried. However, in view of productivity, it is preferable to use a curable film which has been formed beforehand from the above-described epoxy resin composition. When such a curable film is used, there is no need for a cumbersome coating operation, enabling optical waveguides to be manufactured at a high productivity. Moreover, in a case where a curable film is used, an optical waveguide exhibiting unified film thickness in high precision can be formed.

Such a curable film is formed by using, for example, a multicoater having a comma coater head to coat the varnish onto the surface of a release film, such as a release-treated PET film, then drying the varnish.

Next, a method of forming an optical waveguide on a FPC using such a curable film according to the present invention is described in detail while referring to FIG. 1.

To form the optical waveguide, a core and a cladding are formed using, respectively, a cladding-forming curable film and a core-forming curable film, each of which has a refractive index that has been adjusted beforehand. The refractive index of the cladding-forming curable film is adjusted so as to be lower than the refractive index of the core-forming curable film.

Figure 1B:
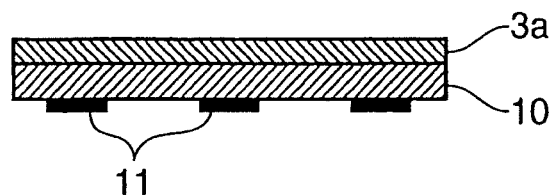

First, as shown in FIG. 1A, a cladding-forming curable film 1 is laminated onto the surface of a flexible printed circuit (FPC) 10 having an electrical circuit 11 formed thereon, following which irradiation with light such as ultraviolet light or heating is carried out so as to cure the cladding-forming curable film 1. The FPC 10 may be, for example, a flexible printed circuit composed of a transparent substrate such as a polyimide film on one side of which an electrical circuit has been formed. By means of such an operation, as shown in FIG. 1B, an undercladding 3a is formed as a layer on the surface of the FPC 10.

Figure 1C:
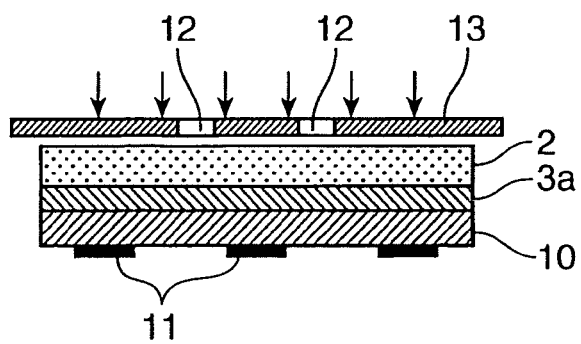

Then, as shown in FIG. 1C, a core-forming curable film 2 is laminated onto the surface of the undercladding 3a, following which a mask in which slits representing the core pattern have been formed is superimposed thereon. The core-forming photocurable film 2 is then exposed in the core pattern by irradiation with light capable of photocuring the film 2, such as UV light, through the slits. Aside from selective exposure using a mask, exposure may be carried out by a direct writing technique that involves irradiation by scanning laser light along the pattern shape.

Figure 1D:
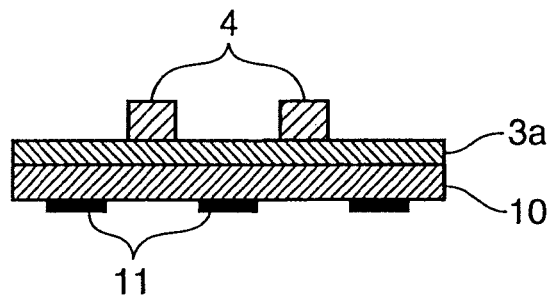

Following exposure, the core-forming photocurable film 2 is developed by using a developer such as a water-based flux cleaner, thereby removing the resin in the unexposed and uncured portions of the core-forming photocurable film 2. In this way, as shown in FIG. 1D, a core 4 having a predetermined core pattern is formed on the surface of the undercladding 3a.

Figure 1E:
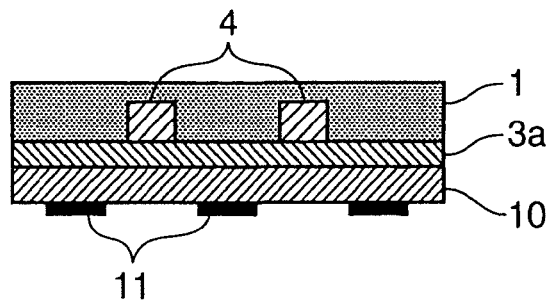
Figure 1F:
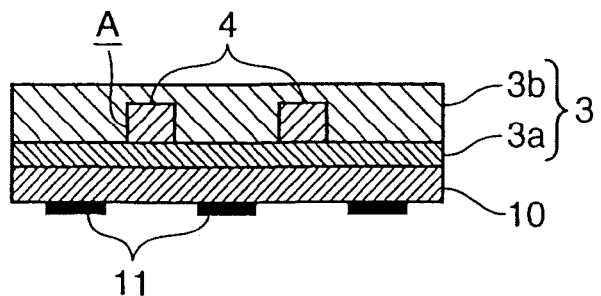

Than, as shown in FIG. 1E, the cladding-forming curable film 1 is laminated and built up so as to cover the undercladding 3a and the core 4. The cladding-forming curable film 1 is then cured by light exposure or heating, thereby forming an overcladding 3b like that shown in FIG. 1F. In this way, an optical waveguide A having a core 4 buried within a cladding 3 composed of an undercladding 3a and an overcladding 3b is formed on the surface of a FPC 10.

Figure 2:
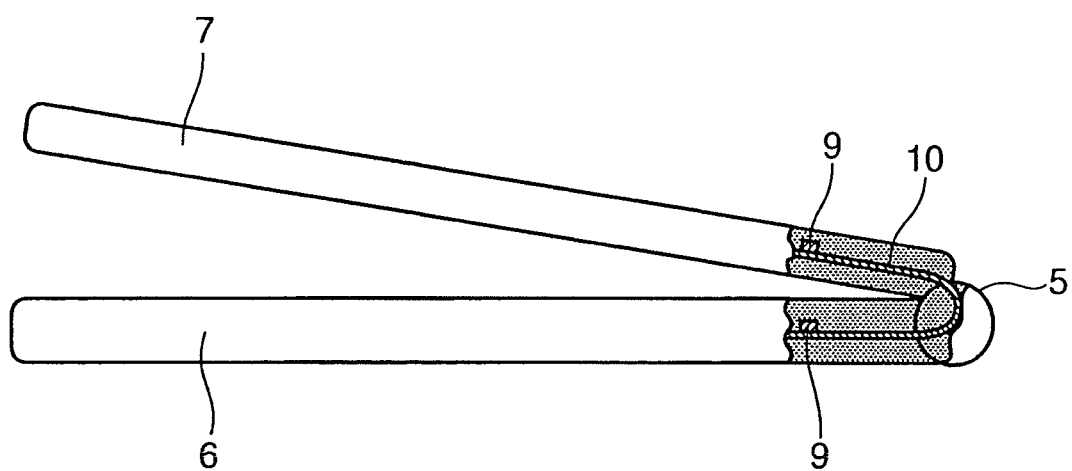
FIG. 2 is a schematic side view of a portable information terminal in which the two structural members are optically connected through the hinge; the periphery of the hinge is shown as a partially cutaway view.

The optical waveguide A formed in this way on the surface of the FPC 10 has a high flex resistance. The FPC 10 on which such an optical waveguide A has been formed may be advantageously used as an optical-transmitting FPC. In particular, it may be advantageously used in, for example, a cell phone or portable information terminal which, as shown in FIG. 2, has two structural members 6 and 7 that can be folded together by means of a hinge 5, and in which the two structural members 6 and 7 are optically connected through, at the hinge 5, a FPC 10 having photoelectric conversion elements 9 mounted thereon.

The present invention is illustrated more fully below by way of working examples. It should be noted, however, that these examples in no way limit the scope of the invention.

EXAMPLES

First, the starting materials used to prepare the epoxy resin compositions in the examples are listed below.

(A) Liquid Epoxy Compounds
  Polyalkylene glycol diglycidyl ether: YL7410, available from Japan Epoxy Resins Co., Ltd.
  Polyethylene glycol diglycidyl ether: Epiol E-1000, available from NOF Corporation
  Epoxy compound of general formula (II): Epiclon EXA-4850-150, available from DIC Corporation
  Bisphenol A-type epoxy compound: Epiclon 850S, available from DIC Corporation
  Hydrogenated bisphenol A-type epoxy compound: YX8000, available from Japan Epoxy Resins Co., Ltd.
  Liquid ε-caprolactone-modified 3,4-epoxycyclohexenyl-methyl-3',4'-epoxycyclohexane carboxylate: Celloxide 2081, available from Daicel Chemical Industries, Ltd.

(B) Solid Epoxy Compounds
  Bisphenol A-type epoxy compound: Epikote 1006FS, available from Japan Epoxy Resins Co., Ltd.
  Hydrogenated bisphenol A-type epoxy compound: YL7170, available from Japan Epoxy Resins Co., Ltd.
  Solid 1,2-epoxy-4-(2-oxiranyl)cyclohexane adduct of 2,2-bis(hydroxymethyl)-1-butanol: EHPE 3150, available from Daicel Chemical Industries, Ltd.

(C) Cationic Curing Agents

Thermocationic curing agent: SI-150L (an $SbF_6$ sulfonium salt), available from Sanshin Chemical Industry Co., LTD.

Photocationic curing agent: SP-170 (an $SbF_6$ sulfonium salt), available from Adeka Corporation (D) Phenoxy Resin YP50, available from Tohto Kasei Co., Ltd.

(E) Surface Modifier

F470, available from DIC Corporation

Next, preparation of the epoxy resin composition and the curable film is described. The respective ingredients were blended together within a glass vessel in the proportions indicated in Table 1 for Working Examples 1 to 10, Reference Example 1 and Comparative Example 1. The resulting blend was refluxed at 60° C. so as to prepare a solution, following which it was passed through a PTFE membrane filter having a pore size of 1 µm, thereby giving an epoxy resin composition varnish. The varnish was coated onto a release-treated PET film (Toyobo product No. A4100). Coating of the varnish was carried out using a multicoater having a comma coater head (Hirano Tecseed Co., Ltd.). The coated varnish was then dried at 125° C., thereby obtaining curable films having thicknesses of 10 µm, 50 µm and 80 µm. Then, a release-treated PET film was laminated onto the surface of the curable film. In Working Examples 1 to 10 and Comparative Example 1 in Table 1, the refractive index was adjusted for cladding formation. In Reference Example 1, the refractive index was adjusted for core formation.

Then, the refractive index and the glass transition temperature Tg of the cured film thus obtained were measured by the following methods.

Refractive Index:

Measurement of the refractive index was carried out as follows. A curable film having a thickness of 80 µm was laminated onto the smooth surface of a high refractive index glass plate (refractive index, 1.6) having dimensions of 30 mm×10 mm×4 mm (thickness) using a compressed air injection-type vacuum laminator (V-130, manufactured by Nichigo-Morton Co., Ltd.) at 60° C. and 0.2 MPa, then exposed by 2 $J/cm^2$ of irradiation with UV light from an ultrahigh-pressure mercury vapor lamp. The release-treated PET film was then peeled off, following which heat treatment was carried out at 150° C. for 1 hour. Next, the surface of the film was polished to make it smooth, and the refractive index of the film was measured using a refractometer manufactured by Atago Co., Ltd.

Glass Transition Temperature (Tg):

Measurement of the Tg was carried out as follows. A curable film having a thickness of 80 µm was exposed by irradiation with 2 $J/cm^2$ of UV light from an ultrahigh-pressure mercury vapor lamp, after which it was heat-treated for 5 minutes at 100° C. The release-treated PET film was then peeled off, and the film alone was additionally heat-treated at 150° C. for 1 hour. This cured film was cut to a size of 5 mm×50 mm and, using a viscoelastic spectrometer (DMS 200, manufactured by Seiko Instruments & Electronics Industrial, Ltd.), the peak temperature of the complex elastic modulus (E") was measured as the Tg.

Next, the method of manufacturing an optical-transmitting flexible printed circuit using the resulting curable film is described while referring to FIG. 3. In the production of the following optical flexible printed circuit, a curable film made of the epoxy resin composition formulated in Reference Example 1 was used as the core-forming curable film 2. Also, in the formation of the undercladding and the overcladding, curable films made of the epoxy resin compositions formulated in Working Examples 1 to 10 and Comparative Example 1 were each used as the cladding-forming curable film 1.

An electrical circuit 11 was formed by patterning the copper foil on one side of a flexible double-sided copper-clad laminate (FELIOS (R-F775), produced by Panasonic Electric Works Co., Ltd.) obtained by laminating 12 µm thick copper foil on both sides of a 25 µm thick polyimide film. The entire surface of the copper foil on the other side of the laminate was removed by etching. In this way, a FPC 10 having outside dimensions of 130 mm×130 mm like that shown in FIG. 3A was manufactured.

Figure 3A:
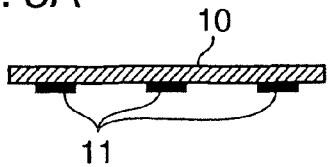
FIGS. 3A to 3I are schematic cross-sectional diagrams showing a method of forming an optical waveguide on the surface of a FPC.
Figure 3B:
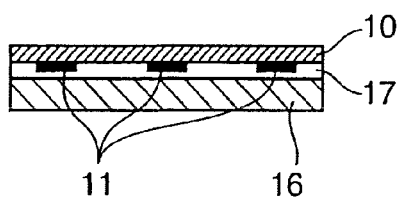

Then, as shown in FIG. 3B, a strong adhesive side of a removable double-sided adhesive tape 17 (No. 7692, available from Teraoka Seisakusho Co., Ltd.) was laminated onto the entire surface of a glass plate 16 (140 mm×140 mm×2 mm thick) using a compressed air injection-type vacuum laminator (V-130, manufactured by Nichigo-Morton Co., Ltd.) at 60° C. and 0.2 MPa. The side of the FPC 10 having a circuit formed thereon was then laminated to a weak adhesive side of the double-sided adhesive tape 17, thereby temporarily bonding the flexible printed circuit 10 to the glass plate 16.

Figure 3C:
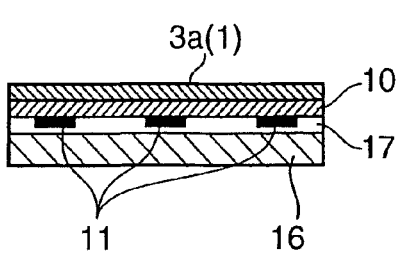

Next, as shown in FIG. 3C, after peeling the PET film from one side only of each of the 10-µm thick cladding-forming curable films 1 in Working Examples 1 to 10 and Comparative Example 1, the curable film 1 was laminated by means of a vacuum laminator onto the surface of the FPC 10 on the side where an electric circuit 11 had not been formed.

The surface of the cladding-forming curable film 1 was then exposed to 2 $J/cm^2$ of UV light using an ultrahigh-pressure mercury vapor lamp, in addition to which the PET film on the other side was peeled off, then heat treatment was carried out at 150° C. for 30 minutes, thereby forming an undercladding 3a. The surface of the undercladding 3a thus formed was then subjected to oxygen plasma treatment.

Figure 3D:
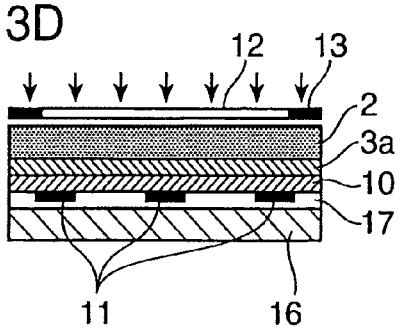
Figure 3E:
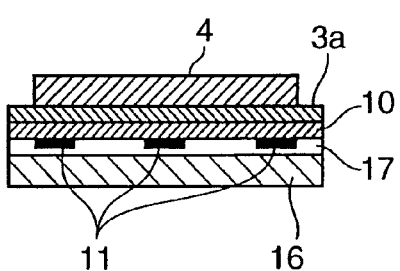

Next, after peeling the PET film from one side only of the 40 µm thick core-forming curable film 2 in Reference Example 1, this curable film 2 was laminated by means of a V-130 vacuum laminator to the surface of the undercladding 3a. Then, as shown in FIG. 3D, the surface of the core-forming curable film 2 was masked with a negative mask 13 having a linear pattern of slits 12 of 40 µm width and 120 mm length, and irradiated with 3 $J/cm^2$ of UV light from an ultrahigh-pressure mercury vapor lamp, thereby photocuring those portions of the core-forming curable film 2 exposed through the slits 12.

Then, the PET film on the other side of the core-forming curable film 2 was peeled off, following which 2 minutes of heat treatment was carried out at 140° C. The unexposed portions of the core-forming curable film 2 were then dissolved and removed by development using a water-based flux cleaner (PINEALPHA ST-100SX, produced by Arakawa Chemical Industries, Ltd.) adjusted to 55° C., after which rinsing with water was carried out. Then, moisture on the surface was removed by air blowing, following which 10 minutes of drying at 100° C. was carried out, thereby forming a core 4 like that shown in FIG. 3E.

Figure 3F:
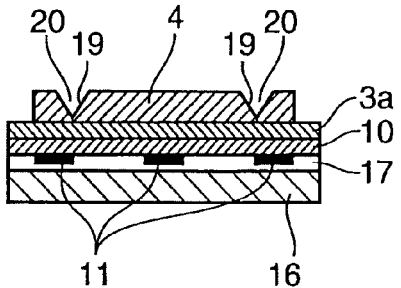

Next, as shown in FIG. 3F, micromirrors 19 for deflecting guided light 90° were formed respectively at places 10 mm from both ends of the core 4. Formation of the micromirrors 19 was carried out as follows.

V-shaped grooves 20 having a depth of 50 µm were formed by moving rotating blades having a rotational speed of 10,000 rpm at a rate of travel of 0.1 mm/s across the resulting core 4 at positions 10 mm from each of the two ends of the core 4. The rotating blades used were #5000 blades, manufactured by Disco Corporation, which had a cutting edge with an apex angle of 90°. Then, solutions of the respective cladding-forming varnishes in Working Examples 1 to 10 and Comparative Example 1 diluted 50-fold in a toluene/MEK=3:7 solvent were lightly coated with a brush onto the surface of the V-shaped grooves 20, then dried for 30 minutes at 100° C. Exposure was then carried out by irradiation with 1 J/cm² of UV light from an ultrahigh-pressure mercury vapor lamp, following which 10 minutes of heat treatment at 120° C. was carried out, thereby smoothing the surfaces of the V-shaped grooves 20. Next, a gold thin-film having a thickness of 1000 Å was formed by the vacuum deposition of gold through a metal mask with openings only at the regions where the V-shaped grooves 20 were formed, thereby giving the micromirrors 19.

Figure 3G:
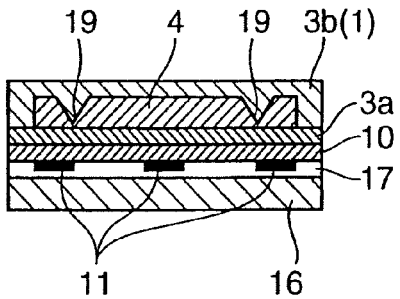

Then, as shown in FIG. 3G, the PET film on one side only of the respective cladding-forming curable films 1, each having a thickness of 50 μm, in Working Examples 1 to 10 and Comparative Example 1 was peeled off, and the cladding-forming curable film 1 was laminated by means of a vacuum laminator at 80° C. and 0.3 MPa so as to cover the undercladding 3a and the core 4. Heat treatment was then carried out at 120° C. for 30 minutes, following which the cladding-forming curable film 1 was irradiated with 2 J/cm² of UV light from an ultrahigh-pressure mercury vapor lamp. The PET film on the other side was then peeled off and heat treatment was carried out for 30 minutes at 150° C., thereby forming an overcladding 3b. The surface of the overcladding 3b that had formed was then subjected to oxygen plasma treatment.

Figure 3H:
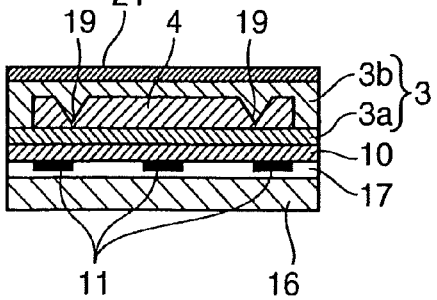

Next, as shown in FIG. 3H, a coverlay film 21 was laminated onto the surface of the overcladding 3b with a vacuum laminator at 120° C. and 0.3 MPa, following which it was heated at 160° C. for hour and thereby cured. A polyimide film (Halogen-Free Coverlay Film R-CAES, produced by Panasonic Electric Works Co., Ltd.) having a thickness of 125 μm and including a 15 μm thick adhesive layer was used as the coverlay film 21.

Figure 3I:
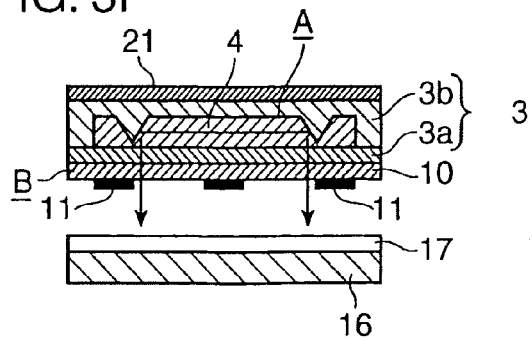

Then, as shown in FIG. 3I, the glass plate was peeled from the weak adhesive side of the double-sided pressure-sensitive adhesive tape 17, following which the completed structure was cut into 5 mm wide strips, thereby obtaining optical-transmitting FPCs in Working Examples 1 to 10 and Comparative Example 1. These FPCs had an optical waveguide A formed by burying the core 4 within a cladding 3 composed of the undercladding 3a and the overcladding 3b. In the optical-transmitting flexible printed circuits thus obtained, the optical path of the guided light that enters and leaves the optical waveguide A is indicated by the arrows in FIG. 3I.

The flex resistance and optical loss of the optical waveguide A in the optical-transmitting FPCs thus obtained were evaluated by the following methods.

Evaluation of Optical Loss

Measurement of optical loss was carried out as follows. The end of an optical fiber having a core diameter of 10 μm and a numerical aperture (NA) of 0.21 was connected through matching oil (silicone oil) at a place corresponding to the micromirror 19 at one end of the core 4 on the surface of the optical-transimitting FPC, and the end of an optical fiber having a core diameter of 200 μm and a NA of 0.4 was connected through matching oil at a place corresponding to the micromirror 19 at the other end of the core 4. Light from an LED light source having a wavelength of 850 nm was introduced to the optical waveguide A from the optical fiber having a core diameter of 10 μm and a NA of 0.21, and the power (P1) of light leaving the optical waveguide A through the optical fiber having a core diameter of 200 μm and a NA of 0.4 was measured with a power meter. In addition, the ends of both optical fibers were butted together and the light power (P0) in a state where the light does not pass through the optical waveguide A was measured with a power meter. The optical loss by the optical waveguide A provided in each of the optical-transmitting FPCs was determined from a formula for calculating the negative log 10 value (P1/P0).

Flex Resistance

The flex resistance was measured as follows. A flexing test was carried out in which each of the optical-transmitting FPCs was repeatedly bent 100,000 times at a radius of curvature of 1 mm and through an angle of ±90°. The optical loss was measured, both before and after this bending test, in the same manner as described above under "Optical Waveguide Loss." Optical-transimitting flexible printed circuits which exhibited an increase in loss of 1 dB or less after the bending test relative to before the test were rated as "Good," and those which exhibited an increase in loss of more than 1 dB were rated as "NG."

TABLE 1

| | | | WORKING EXAMPLE 1 | WORKING EXAMPLE 2 | WORKING EXAMPLE 3 | WORKING EXAMPLE 4 | WORKING EXAMPLE 5 | WORKING EXAMPLE 6 |
|---|---|---|---|---|---|---|---|---|
| RESIN VARNISH COMPOSITION (PBM) | LIQUID EPOXY COMPOUND | A | 10 | 10 | — | 20 | 25 | 25 |
| | | B | 5 | 5 | — | — | — | — |
| | | C | 5 | 15 | 25 | 30 | — | — |
| | | D | — | — | — | — | 7 | 15 |
| | | E | — | — | — | — | — | — |
| | | F | — | — | — | — | — | — |
| | SOLID EPOXY COMPOUND | G | 60 | 50 | 50 | 20 | 20 | 20 |
| | | H | — | — | 5 | 10 | 20 | 20 |
| | | I | — | — | — | — | 8 | — |
| | PHENOXY RESIN | | 20 | 20 | 20 | 20 | 20 | 20 |
| | RESIN TOTAL | | 100 | 100 | 100 | 100 | 100 | 100 |
| | PHOTOCATIONIC CURING AGENT | | 0.5 | 0.5 | 0.5 | 0.5 | 0.5 | 0.5 |
| | THERMOCATIONIC CURING AGENT | | 0.5 | 0.5 | 0.5 | 0.5 | 0.5 | 0.5 |
| | SURFACE MODIFIER | | 0.1 | 0.1 | 0.1 | 0.1 | 0.1 | 0.1 |
| | METHYL ETHYL KETONE | | 30 | 30 | 30 | 30 | 30 | 30 |
| | TOLUENE | | 70 | 70 | 70 | 70 | 70 | 70 |
| TEST RESULTS | Tg(° C.) | | 78 | 60 | 30 | <25 | 64 | 35 |
| | REFRACTIVE INDEX (DIMENSIONLESS) | | 1.530 | 1.531 | 1.531 | 1.529 | 1.548 | 1.545 |
| | LIGHT LOSS (db/cm) | | <0.1 | <0.1 | <0.1 | <0.1 | <0.1 | <0.1 |
| | FLEX RESISTANCE | | GOOD | GOOD | GOOD | GOOD | GOOD | GOOD |

TABLE 1-continued

|  |  |  | WORKING EXAMPLE 7 | WORKING EXAMPLE 8 | WORKING EXAMPLE 9 | WORKING EXAMPLE 10 | COMPARATIVE EXAMPLE 1 | REFERENCE EXAMPLE 1 |
|---|---|---|---|---|---|---|---|---|
| RESIN VARNISH COMPOSITION (PBM) | LIQUID EPOXY COMPOUND | A | 12 | 7 | 5 | — | 32 | — |
|  |  | B | — | — | — | — | — | 26 |
|  |  | C | — | — | — | — | — | — |
|  |  | D | — | — | — | — | — | — |
|  |  | E | 5 | 10 | 15 | 20 | — | — |
|  |  | F | — | — | — | — | — | 10 |
|  | SOLID EPOXY COMPOUND | G | 60 | 65 | 67 | 72 | 20 | — |
|  |  | H | — | — | — | — | 20 | 61 |
|  |  | I | 8 | 8 | 8 | 8 | 8 | — |
|  | PHENOXY RESIN |  | 15 | 10 | 5 | — | 20 | 3 |
|  | RESIN TOTAL |  | 100 | 100 | 100 | 100 | 100 | 100 |
|  | PHOTOCATIONIC CURING AGENT |  | 0.5 | 0.5 | 0.5 | 0.5 | 0.5 | 1 |
|  | THERMOCATIONIC CURING AGENT |  | 0.5 | 0.5 | 0.5 | 0.5 | 0.5 | 0 |
|  | SURFACE MODIFIER |  | 0.1 | 0.1 | 0.1 | 0.1 | 0.1 | 0.1 |
|  | METHYL ETHYL KETONE |  | 30 | 30 | 30 | 30 | 30 | 30 |
|  | TOLUENE |  | 70 | 70 | 70 | 70 | 70 | 70 |
| TEST RESULTS | Tg(° C.) |  | 93 | 78 | 67 | 59 | 97 | 130 |
|  | REFRACTIVE INDEX (DIMENSIONLESS) |  | 1.530 | 1.529 | 1.526 | 1.527 | 1.543 | 1.582 |
|  | LIGHT LOSS (db/cm) |  | <0.1 | <0.1 | <0.1 | <0.1 | <0.1 | — |
|  | FLEX RESISTANCE |  | GOOD | GOOD | GOOD | GOOD | NG | — |

A: LIQUID HYDROGENATED BISPHENOL A-TYPE EPOXY RESIN (YX8000)
B: LIQUID BISPHENOL A-TYPE EPOXY RESIN (EPICLON 850S)
C: LIQUID POLYALKYLENE GLYCOL DIGLYCIDYL ETHER (YL7410)
D: LIQUID POLYETHYLENE GLYCOL DIGLYCIDYL ETHER (EPIOL E-1000)
E: LIQUID EPOXY RESIN OF GENERAL FORMULA (II) (EPICLON EXA-4850-150)
F: LIQUID -CAPROLACTONE-MODIFIED 3,4-EPOXYCYCLOHEXENYLMETHYL-3',4'-EPOXYCYCLOHEXANE CARBOXYLATE (CELLOXIDE 2081)
G: SOLID HYDROGENATED BISPHENOL A-TYPE EPOXY RESIN (YL7170)
H: SOLID BISPHENOL A-TYPE EPOXY RESIN (EPIKOTE 1006FS)
I: SOLID 1,2-EPOXY-4-(2-OXIRANYL)CYCLOHEXANE ADDUCT OF 2,2-BIS(HYDROXYMETHYL)-1-BUTANOL (EHPE 3150)

From Table 1, all of the optical-transmitting FPCs of Working Examples 1 to 10 according to the invention in which the cladding was formed using a curable film which included a liquid epoxy compound of general formula (I) exhibited high flex resistances. Also, it was apparent that, in Working Examples 7 to 10 in which liquid epoxy compounds of general formula (II) were used, even when these liquid compounds were included in a relatively high proportion, a high flex resistance was maintained without a large decline in the Tg. On the other hand, in the optical-transmitting flexible printed circuit of Comparative Example 1 in which a liquid epoxy compound of general formula (I) was not included, a high glass transition temperature was maintained, but the flex resistance was low.

As previously described, The optical waveguide-forming epoxy resin composition according to one aspect of the invention is composed of (A) a liquid epoxy compound, (B) a solid epoxy compound, and (C) a cationic curing initiator, wherein the liquid epoxy compound (A) includes (A1) a liquid epoxy compound represented by the above general formula (I). Such a composition enables a transparent cured product of excellent flexibility to be obtained. Therefore, by using such an epoxy resin composition, an optical waveguide of excellent flex resistance can be formed on the surface of a flexible printed circuit.

It is especially preferable for the liquid epoxy compound of general formula (I) to be a liquid resin represented by the above general formula (II). When such a liquid epoxy compound is used, it is possible to impart a sufficient flex resistance while maintaining a high heat resistance. Also, when such an epoxy resin composition is used, a curable film of excellent productivity which enables an optical waveguide to be formed without the use of a coating step can easily be obtained.

Having the epoxy compound (A1) content be within a range of from 5 to 40 mass % of the total content of the resin components is preferable for achieving a good balance with other properties required of the optical waveguide.

The optical waveguide-forming curable film according to another aspect of the invention is characterized by being obtained from the foregoing optical waveguide-forming epoxy resin compositions. By using such a curable film, it is possible to form a layer of uncured resin on a substrate with a transfer technique that employs a transfer device such as a vacuum laminator. By using such a transfer technique, a cured layer in which the film thickness has been controlled to a high precision can be formed on the surface of a FPC. In addition, because a coating step is not required, optical waveguides can be formed at an excellent productivity.

The optical-transmitting flexible printed circuit according to yet another aspect of the invention has an optical waveguide composed of a cladding and/or a core obtained by curing the above optical waveguide-forming epoxy resin compositions. By being constructed in this way, the resulting optical waveguide has a high flex resistance, enabling it to be used as an optical waveguide at places which require resistance to repeated flex in folding areas that have a small radius of curvature, such as the hinge of a folding-type electronic information device.

The electronic information device according to a further aspect of the invention is composed of two structural members which can be folded together by means of a hinge. The two structural members are optically connected through the hinge, and the above optical-transmitting flexible printed circuit is disposed at the hinge. In such electronic information devices, a flexible printed circuit on which an optical waveguide having an excellent flex resistance has been formed can be build into devices having a hinge which folds at a small radius of curvature for use as the hinge. As a result, folding-type electronic information devices having built-in optical waveguides can be made smaller in size.

INDUSTRIAL APPLICABILITY

According to the present invention, an optical waveguide having excellent flex resistance can be formed on the surface of a FPC.

The invention claimed is:

1. An optical waveguide-forming epoxy resin composition, comprising (A) a liquid epoxy compound, (B) a solid epoxy compound, and (C) a cationic curing initiator, wherein the liquid epoxy compound (A) includes (A1) a liquid epoxy compound represented by general formula (II) below:

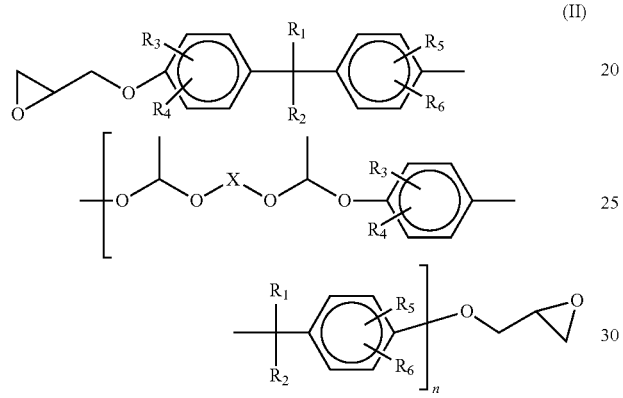

(II)

where $R_1$ and $R_2$ are each independently a hydrogen atom or a methyl group; $R_3$ to $R_6$ are each independently a hydrogen atom, a methyl group, a chlorine atom or a bromine atom; X is an ethylene, di(ethyleneoxy)ethyl, tri(ethyleneoxy)ethyl, propylene, propyleneoxypropyl, di(propyleneoxy)propyl, tri(propyleneoxy)propyl group, or an alkylene group of 2 to 15 carbons; and n is a positive integer which averages from 1.2 to 5.

2. The optical waveguide-forming epoxy resin composition according to claim 1, wherein the content of epoxy compound (A) is in a range of from 5 to 40 mass % of the total content of resin components.

3. An optical waveguide-forming curable film which is obtained from the optical waveguide-forming epoxy resin composition according to claim 1.

4. An optical-transmitting flexible printed circuit comprising an optical waveguide composed of cladding and/or a core obtained by curing the optical waveguide-forming epoxy resin composition according to claim 1.

5. An electronic information device comprising two structural members which can be folded together by means of a hinge, the two structural members being optically connected through the hinge, wherein the optical-transmitting flexible printed circuit according to claim 4 is disposed at the hinge.

* * * * *